(12) United States Patent
Li et al.

(10) Patent No.: US 11,538,892 B2
(45) Date of Patent: Dec. 27, 2022

(54) DISPLAY PANEL HAVING CIRCUITS ON OPPOSING SIDES OF INSULATING SUBSTRATE CONNECTED BY TAPERED THROUGH HOLE AND PAD, MANUFACTURING METHOD THEREOF, AND DISPLAY DEVICE

(71) Applicant: BOE TECHNOLOGY GROUP CO., LTD., Beijing (CN)

(72) Inventors: Shulei Li, Beijing (CN); Hua Huang, Beijing (CN); Changhan Hsieh, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 180 days.

(21) Appl. No.: 17/042,625

(22) PCT Filed: Apr. 9, 2020

(86) PCT No.: PCT/CN2020/083890
§ 371 (c)(1),
(2) Date: Sep. 28, 2020

(87) PCT Pub. No.: WO2020/207422
PCT Pub. Date: Oct. 15, 2020

(65) Prior Publication Data
US 2021/0159303 A1 May 27, 2021

(30) Foreign Application Priority Data
Apr. 11, 2019 (CN) .................. 201910289059.X (51) Int. Cl.
*H01L 27/32* (2006.01)
*H01L 51/00* (2006.01)
*H01L 51/56* (2006.01)

(52) U.S. Cl.
CPC ........ *H01L 27/3276* (2013.01); *H01L 51/003* (2013.01); *H01L 51/0097* (2013.01);
(Continued)

(58) Field of Classification Search
None
See application file for complete search history.

(56) References Cited

U.S. PATENT DOCUMENTS 9,504,124 B2   11/2016  Han et al.
10,879,339 B2 * 12/2020  Ke .................. H01L 27/124
(Continued)

FOREIGN PATENT DOCUMENTS

CN    104904327 A    9/2015
CN    107579075 A    1/2018
(Continued)

OTHER PUBLICATIONS

"OLED Display SSD1306 Pinout, Interfacing wit Arduino, Applications" downloaded from URL<OLED Display SSD1306 Pinout, Interfacing with Arduino, Applications https://microcontrollerslab.com/oled-display-pinout-interfacing-arduino-applications-features/> on May 24, 2022 (Year: 2013).*
(Continued)

*Primary Examiner* — J. E. Schoenholtz
(74) *Attorney, Agent, or Firm* — Chiwin Law LLC (57) ABSTRACT

A display panel, a manufacturing method of the display panel, and a display device including the display panel are provided. The display panel includes an insulating substrate; a first circuit at a first side of the insulating substrate; and a second circuit at a second side of the insulating substrate. The first side and the second side of the insulating substrate are opposite to each other in a first direction perpendicular to a display surface, and the first circuit and the second circuit on opposing sides of the insulating substrate are
(Continued)

electrically connected by tapered through hole and tapered pad.

17 Claims, 11 Drawing Sheets

(52) U.S. Cl.
CPC ........ *H01L 51/56* (2013.01); *H01L 2227/323* (2013.01); *H01L 2227/326* (2013.01); *H01L 2251/5338* (2013.01)

(56) References Cited

U.S. PATENT DOCUMENTS

| | | |
|---|---|---|
| 2009/0174924 A1 | 7/2009 | Kubota |
| 2014/0184057 A1* | 7/2014 | Kim ................. H05B 33/145 313/504 |
| 2014/0246687 A1 | 9/2014 | Ha et al. |
| 2015/0021081 A1* | 1/2015 | Mitarai ................. H01L 23/15 29/846 |
| 2018/0012549 A1 | 1/2018 | Lee et al. |
| 2019/0237531 A1 | 8/2019 | Chen |
| 2019/0348631 A1* | 11/2019 | Chen ................. G02F 1/133305 |
| 2020/0105790 A1 | 4/2020 | Gu et al. |
| 2020/0119124 A1* | 4/2020 | Ahn ................. H01L 51/0097 |
| 2020/0126458 A1 | 4/2020 | Xiao |
| 2020/0127073 A1* | 4/2020 | Ke ................. H01L 27/1262 |
| 2020/0219961 A1* | 7/2020 | Managaki ........... H01L 27/3248 |

FOREIGN PATENT DOCUMENTS

| | | |
|---|---|---|
| CN | 108155220 A | 6/2018 |
| CN | 109003544 A | 12/2018 |
| CN | 109244086 A | 1/2019 |
| CN | 110265432 A | 9/2019 |
| KR | 20090076790 A | 7/2009 |

OTHER PUBLICATIONS

Definition of Pillar downloaded from URL<https://www.merriam-webster.com/dictionary/pillar> on May 24, 2022. (Year: 2022).*
First office action issued in Chinese Patent No. 201910289059.X with search report.

* cited by examiner

DISPLAY PANEL HAVING CIRCUITS ON OPPOSING SIDES OF INSULATING SUBSTRATE CONNECTED BY TAPERED THROUGH HOLE AND PAD, MANUFACTURING METHOD THEREOF, AND DISPLAY DEVICE

CROSS-REFERENCE OF RELATED APPLICATIONS

This application is a U.S. National Phase Entry of International Application No. PCT/CN2020/083890 filed on Apr. 9, 2020, designating the United States of America and claiming priority to Chinese Patent Application No. 201910289059.X, filed on Apr. 11, 2019. The present application claims priority to and the benefit of the above-identified applications and the above-identified applications are incorporated by reference herein in their entirety.

TECHNICAL FIELD

Embodiments of the present disclosure relates to a display panel, a display device including the display panel, and a manufacturing method of the display panel.

BACKGROUND

A display panel includes a plurality of circuits to realize functions of drive and control, etc. Generally, these circuits are provided in the non-display region located at the periphery of the display region in order not to affect the display function of the display panel. However, these circuits arranged at the periphery of the display region disadvantageously increase the bezel region of the display panel, which is contrary to the development trend of miniaturization, narrow bezel or even no bezel in the field of display panel.

On the other hand, a flexible display panel achieves certain flexibility by adopting a flexible substrate, and can even be folded and curled like paper, thus completely subverting people's understanding of traditional display panels and becoming one of the hot spots in the field of display technology at present.

SUMMARY

Embodiments of the present disclosure provide a display panel and a manufacturing method thereof, and a display device.

At least one embodiment of the present disclosure provides a display panel, including: an insulating substrate; a first circuit at a first side of the insulating substrate; and a second circuit at a second side of the insulating substrate; the display panel includes a display surface, the first side and the second side of the insulating substrate are opposite to each other in a first direction perpendicular to the display surface, and the first circuit and the second circuit are electrically connected via a conductor penetrating the insulating substrate in the first direction.

According to the display panel provided by some embodiments of the present disclosure, the display surface includes a display region and a non-display region surrounding the display region, and the conductor is located in the non-display region.

According to the display panel provided by some embodiments of the present disclosure, the display surface includes a display region, and the conductor is located in the display region.

According to the display panel provided by some embodiments of the present disclosure, the display panel further includes an insulating layer which is at a side of the first circuit facing away from the insulating substrate and exposes a part of the first circuit, the conductor penetrates the insulating layer in the first direction.

According to the display panel provided by some embodiments of the present disclosure, a plurality of conductors are provided, the first circuit includes a driving transistor, a light emitting unit, a gate line and a data line, the gate line and the data line extend in different directions, the insulating layer covers the driving transistor, the gate line and the data line, and exposes the light emitting unit, a control terminal of the driving transistor is connected with the gate line, a first terminal of the driving transistor is connected with the data line, and a second terminal of the driving transistor is connected with a first electrode of the light emitting unit, and the gate line, the data line, and a second electrode of the light emitting unit are electrically connected with the second circuit via the plurality of conductors, respectively.

According to the display panel provided by some embodiments of the present disclosure, a plurality of conductors are provided, the first circuit includes a driving transistor, a light emitting unit, a gate line and a data line, the gate line and the data line extend in different directions, a control terminal of the driving transistor is connected with the gate line, a first terminal of the driving transistor is connected with the data line, and a second terminal of the driving transistor is connected with a first electrode of the light emitting unit, the insulating layer covers the gate line, the data line, and a part of the driving transistor other than the second terminal of the driving transistor, and exposes the light emitting unit and the second terminal of the driving transistor, and the gate line, the data line, and a second electrode of the light emitting unit are electrically connected with the second circuit via the plurality of conductors, respectively.

According to the display panel provided by some embodiments of the present disclosure, the conductor includes a conductive portion formed by filling a conductive material into a via hole penetrating the insulating substrate in the first direction, and a conductive pillar penetrating the insulating layer in the first direction, and the conductive pillar is electrically connected with the conductive portion.

According to the display panel provided by some embodiments of the present disclosure, the conductive portion is in contact with the conductive pillar.

According to the display panel provided by some embodiments of the present disclosure, the via hole has a tapered shape from the second side to the first side of the insulating substrate.

According to the display panel provided by some embodiments of the present disclosure, the tapered shape has a slope angle of 45-90 degrees.

According to the display panel provided by some embodiments of the present disclosure, an area of a cross section of a side of the conductive portion close to the first circuit is smaller than an area of a cross section of a side of the conductive portion close to the second circuit.

According to the display panel provided by some embodiments of the present disclosure, the display panel is flexible, and the insulating substrate includes a flexible insulating material.

According to the display panel provided by some embodiments of the present disclosure, the first circuit includes one or more of the following: a gate driving circuit and a driving transistor electrically connected with each other; a pixel driving circuit; a peripheral circuit; and a compensation circuit; the second circuit includes an integrated driving circuit.

According to the display panel provided by some embodiments of the present disclosure, the first circuit is formed before the second circuit.

At least one embodiment of the present disclosure further provides a display device, including any display panel described above.

At least one embodiment of the present disclosure further provides a manufacturing method of a display panel, including: providing a first circuit at a first side of an insulating substrate; providing a second circuit at a second side of the insulating substrate, the first side and the second side of the insulating substrate being opposite to each other in a first direction, and the first direction being perpendicular to a display surface of the display panel; and providing a conductor penetrating the insulating substrate in the first direction, so that the first circuit and the second circuit are electrically connected via the conductor.

According to the method provided by some embodiments of the present disclosure, the providing the first circuit, the providing the second circuit, and the providing the conductor are sequentially performed in the following order: providing the first circuit, providing the conductor, and providing the second circuit.

According to the method provided by some embodiments of the present disclosure, after the providing the first circuit and before the providing the conductor, the method further includes turning over the insulating substrate and forming a via hole in the insulating substrate.

According to the method provided by some embodiments of the present disclosure, the via hole has a tapered shape from the second side to the first side of the insulating substrate.

According to the method provided by some embodiments of the present disclosure, the method further includes: providing an insulating layer at a side of the first circuit facing away from the insulating substrate, the insulating layer exposing a part of the first circuit, the conductor penetrates the insulating layer in the first direction.

According to the method provided by some embodiments of the present disclosure, the providing the conductor penetrating the insulating substrate in the first direction includes: forming a via hole penetrating the insulating substrate in the first direction; forming a conductive pillar penetrating the insulating layer in the first direction; and filling the via hole with a conductive material to form a conductive portion; the conductive pillar is in contact with the conductive portion.

According to the method provided by some embodiments of the present disclosure, the forming the conductive pillar is performed before the forming the via hole penetrating the insulating substrate.

According to the method provided by some embodiments of the present disclosure, the method further includes: providing the insulating substrate on a first carrier before providing the first circuit and the second circuit, the second side of the insulating substrate facing the first carrier; bonding the insulating substrate to a second carrier after providing the first circuit and before providing the second circuit, the first side of the insulating substrate facing the second carrier; removing the first carrier after bonding the insulating substrate to the second carrier and before providing the second circuit; and removing the second carrier after providing the second circuit; the insulating substrate is formed of a flexible insulating material.

According to the method provided by some embodiments of the present disclosure, the display surface includes a display region and a non-display region surrounding the display region, and the conductor is located in the non-display region.

According to the method provided by some embodiments of the present disclosure, the display surface includes a display region, and the conductor is located in the display region.

BRIEF DESCRIPTION OF THE DRAWINGS

In order to clearly illustrate the technical solutions of the embodiments of the present disclosure, the drawings of the embodiments will be briefly described in the following; it is obvious that the described drawings are only related to some embodiments of the present disclosure without construing any limitation to the present disclosure.

DETAILED DESCRIPTION

In order to describe the objects, technical details and advantages of the embodiments of the present disclosure more clear, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Figure 1:
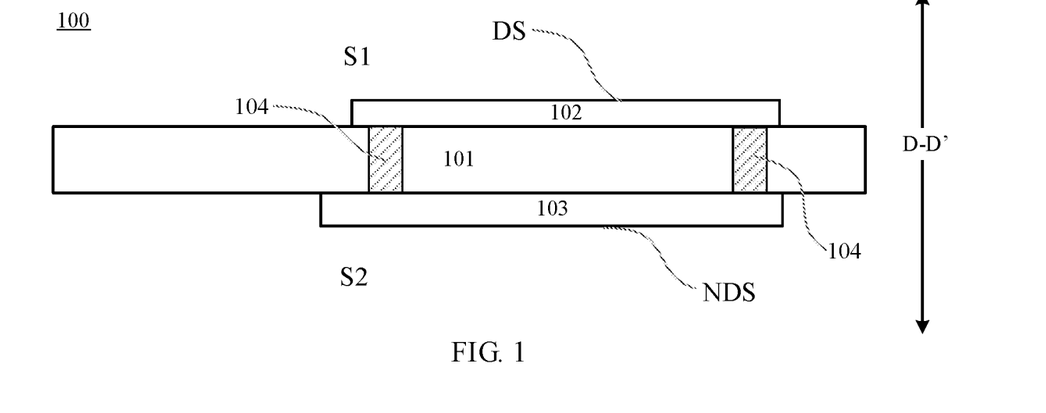
FIG. 1 schematically illustrates a cross-sectional view of a display panel according to an embodiment of the present disclosure.
Figure 2:
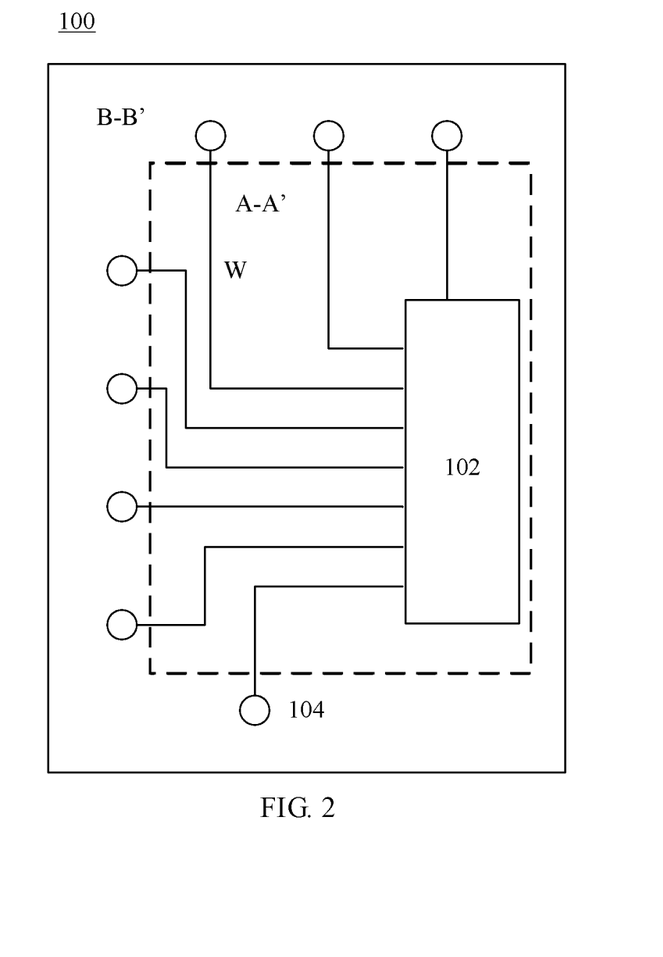
FIG. 2 schematically illustrates a top view of the display panel shown in FIG. 1.
Figure 3:
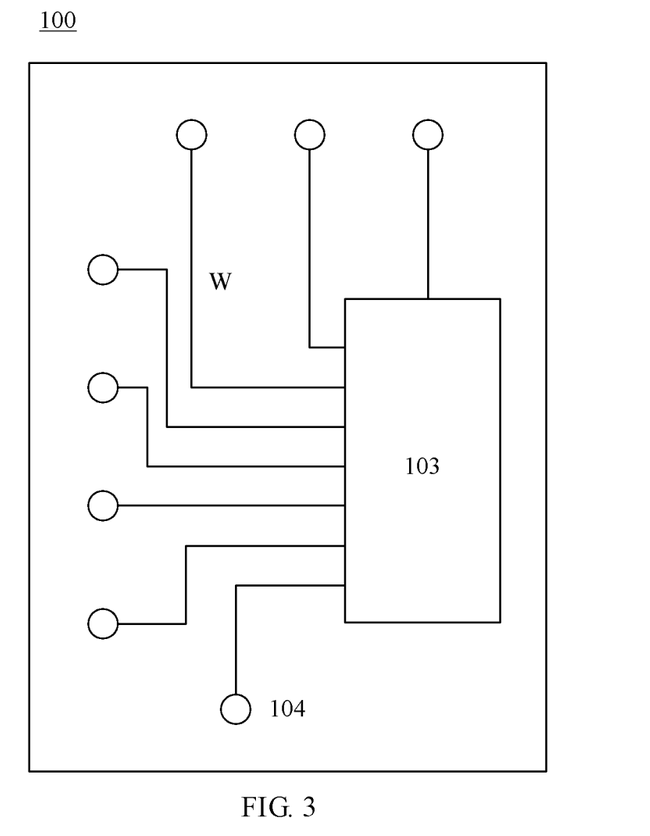
FIG. 3 schematically illustrates a bottom view of the display panel shown in FIG. 1.

FIG. 1 is a cross-sectional view of a display panel according to one embodiment of the present disclosure, FIG. 2 is a top view thereof, and FIG. 3 is a bottom view thereof. As shown in FIGS. 1-3, a display surface DS of the display panel 100 includes a display region A-A' and a non-display region B-B' surrounding the display region A-A'. For example, as shown in FIG. 1, the display surface DS is a top surface of the display panel 100. For example, as shown in FIG. 1, a non-display surface NDS is opposite to the display surface DS. For example, the display panel 100 includes an insulating substrate 101, a first circuit 102 located at a first side S1 of the insulating substrate 101, and a second circuit 103 located at a second side S2 of the insulating substrate 101. The first side S1 and the second side S2 of the insulating substrate 101 are opposite to each other in a first direction D-D' perpendicular to the display surface DS, and the first circuit 102 and the second circuit 103 are electrically connected via a conductor 104. The conductor 104 penetrates the insulating substrate 101 in the first direction D-D' and is located in the non-display region B-B'. Optionally, as shown in FIG. 2 and FIG. 3, the first circuit 102 and the second circuit 103 are electrically connected with the conductor 104 through wires W, respectively.

It should be noted that the cross section of the conductor 104 is shown as a circle in FIGS. 1-3, but it is not limited thereto. In other embodiments of the present disclosure, the conductor 104 can have a cross section of any other shapes, and as will be described below, the conductor 104 may not be a regular cylinder as shown in FIG. 1. It should also be noted that the first circuit 102 and the second circuit 103 are shown in FIGS. 1-3 as being electrically connected to the conductor 104 through the wires W, but they are not limited thereto. In other embodiments of the present disclosure, the first circuit 102 and/or the second circuit 103 may be directly electrically connected with the conductor 104 without any intermediate element.

In the above-mentioned display panel, the first circuit and the second circuit are provided at opposite sides of the display panel, respectively, and the first circuit and the second circuit are electrically connected via the conductor. Compared with the scheme in which both the first circuit and the second circuit are provided at the periphery of the display region, the bezel region of the display panel provided by the embodiment of the present disclosure can be significantly reduced, and the integration of interconnection structures in the display panel can be improved, thereby being beneficial to miniaturization and narrow bezel of the display panel.

Figure 4:
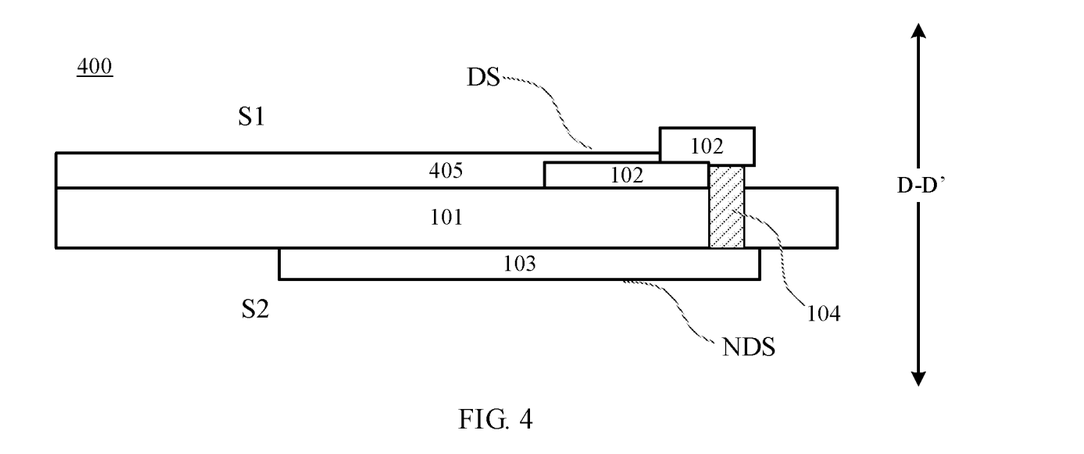
FIG. 4 schematically illustrates a cross-sectional view of a display panel according to another embodiment of the present disclosure.

FIG. 4 is a schematic cross-sectional view of a display panel according to another embodiment of the present disclosure. The display panel shown in FIG. 4 has the same partial structure and/or configuration as the display panel shown in FIG. 1. Therefore, elements having substantially the same functions as those in the embodiment shown in FIG. 1 will be numbered the same here, and will not be described and/or illustrated in detail here for the sake of brevity.

Compared with the display panel 100 shown in FIG. 1, the display panel 400 in FIG. 4 further includes an insulating layer 405 which is located at a side of the first circuit 102 facing away from the insulating substrate 101 and exposes a part of the first circuit 102, and the conductor 104 also penetrates the insulating layer 405 in the first direction D-D'.

Figure 5A:
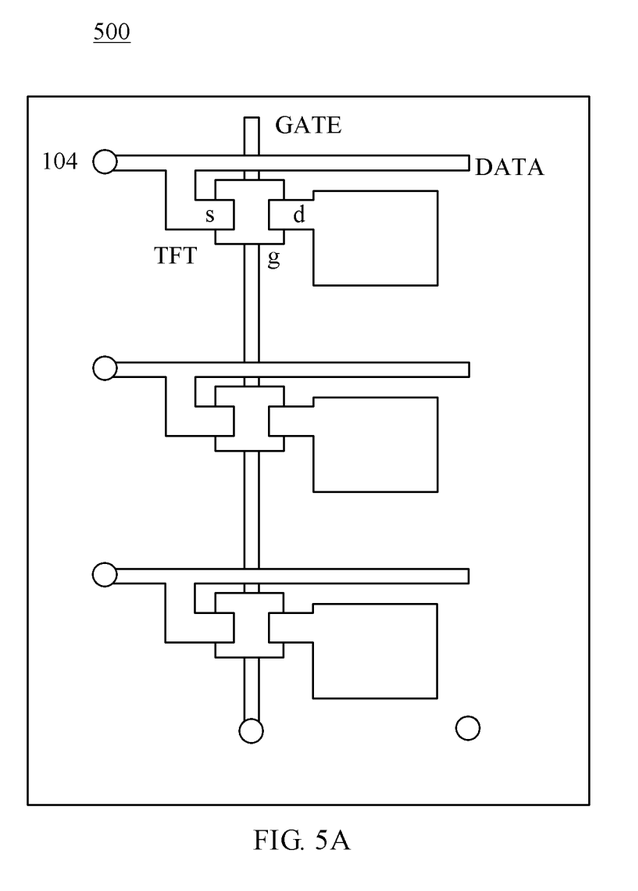
FIGS. 5A-5C schematically illustrate top views of a display panel according to an embodiment of the present disclosure.
Figure 5B:
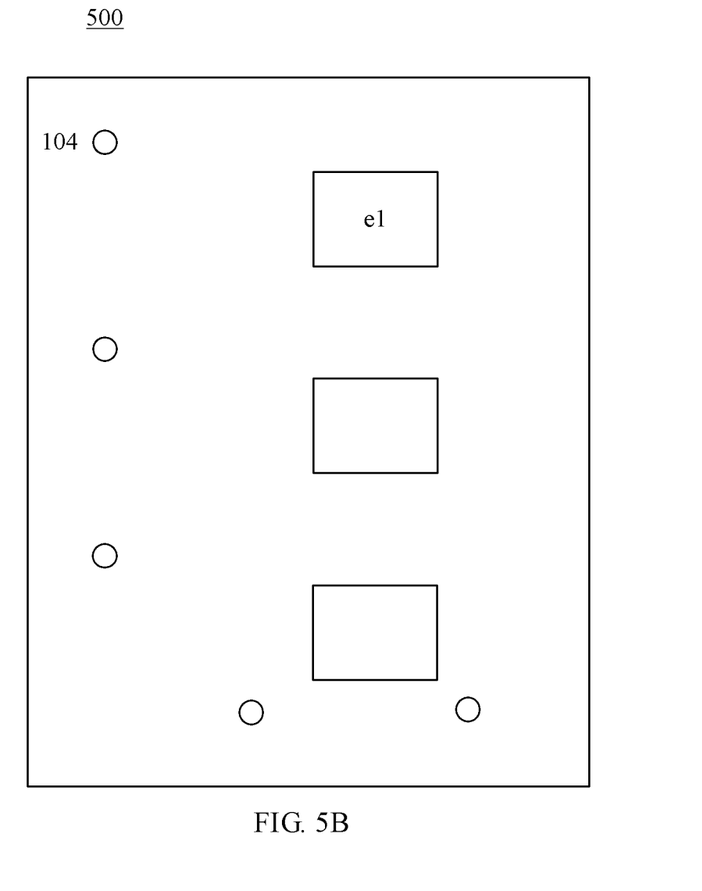
Figure 5C:
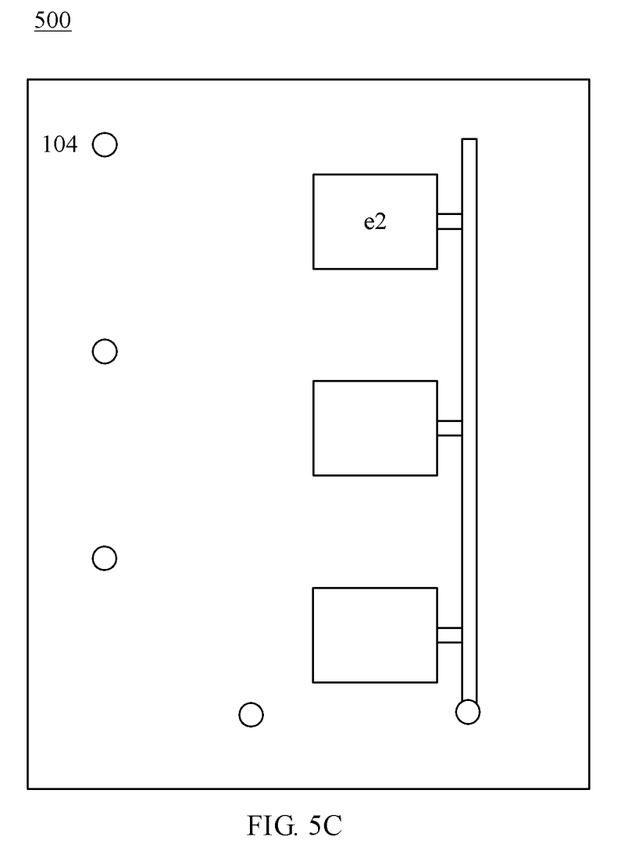

In one implementation of the embodiment shown in FIG. 4, as shown in FIGS. 5A-5C, the display panel 500 is an organic light emitting diode (OLED) display panel. In order to show the arrangement of the OLED display panel more clearly, the insulating layer 405 and those portions located on the insulating layer 405 are removed in FIG. 5A, the OLED light emitting functional layer and those portions located on the OLED light emitting functional layer are removed in FIG. 5B, and FIG. 5C is a top view of the OLED display panel. As shown in FIGS. 5A-5C, the first circuit 102 includes a driving transistor TFT, a light emitting unit OLED, and a gate line GATE and a data line DATA, the gate line GATE and the data line DATA extend in different directions. The insulating layer 405 covers the driving transistor TFT, the gate line GATE and the data line DATA, and exposes the light emitting unit OLED. A control terminal g of the driving transistor TFT is connected with the gate line GATE, a first terminal s of the driving transistor TFT is connected with the data line DATA, and a second terminal d of the driving transistor TFT is connected with a first electrode e1 of the light emitting unit OLED. The gate line GATE, the data line DATA, and a second electrode e2 of the light emitting unit OLED are electrically connected with the second circuit 103 via the conductors 104, respectively, and can be applied with signals, respectively. The light emitting unit OLED includes the first electrode e1, the second electrode e2, and a functional stacked layer sandwiched between the first electrode e1 and the second electrode e2. As known to those skilled in the art, the functional stacked layer may include a light emitting layer, and may further include at least one selected from the group consisting of an electron transport layer, a hole transport layer, an electron injection layer and a hole injection layer.

Figure 6A:
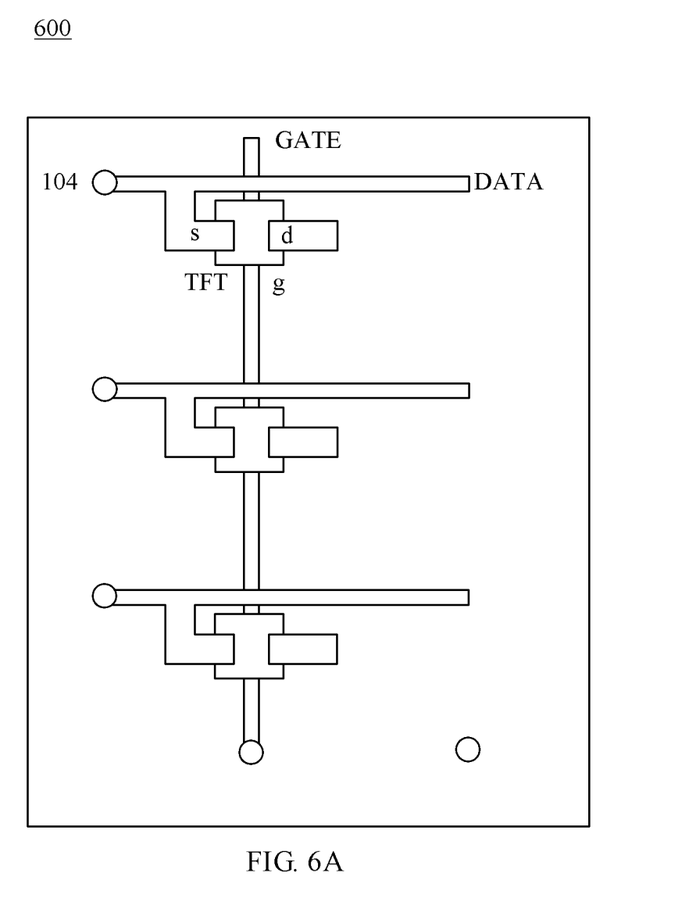
FIGS. 6A-6C schematically illustrate top views of a display panel according to another embodiment of the present disclosure.
Figure 6B:
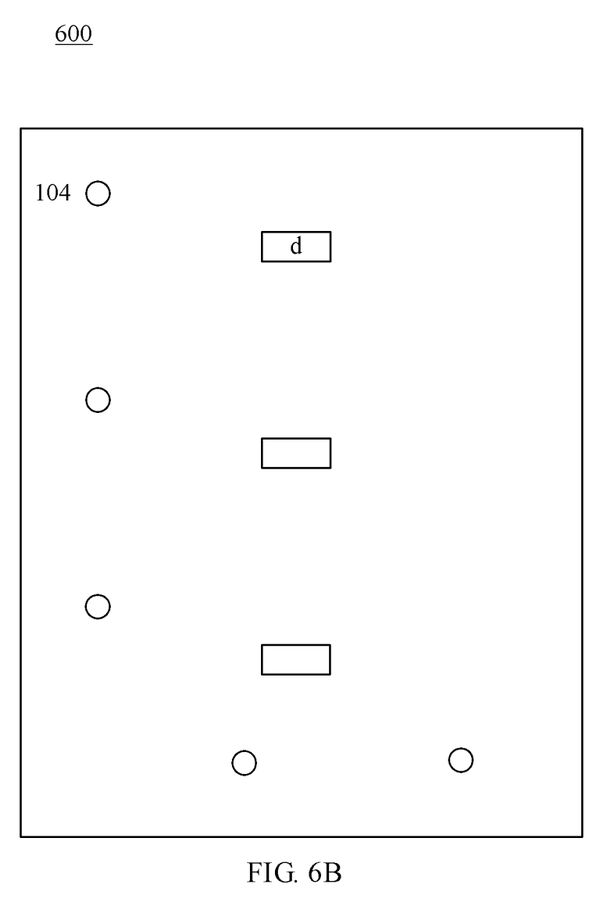
Figure 6C:
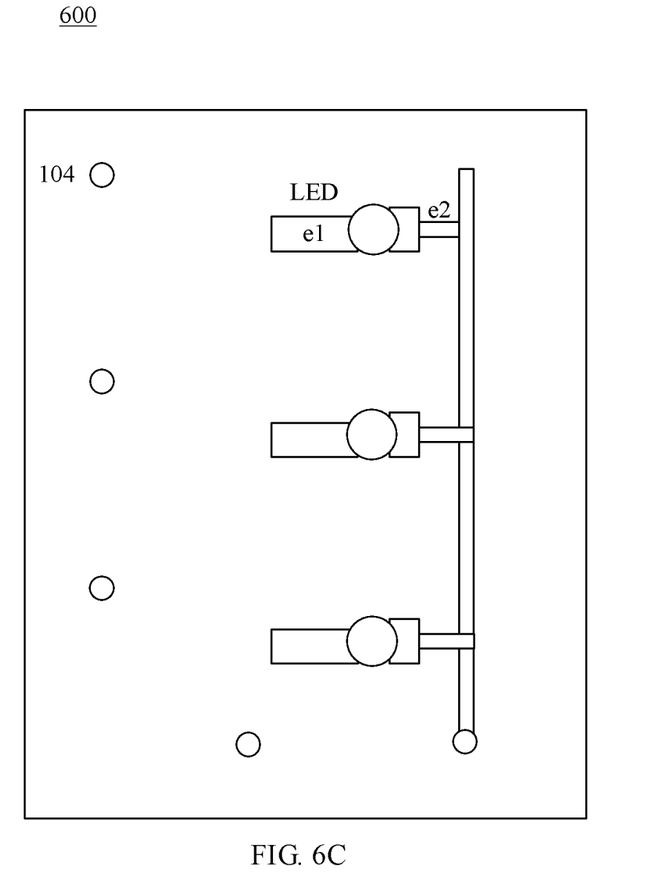

In another implementation of the embodiment shown in FIG. 4, as shown in FIGS. 6A-6C, the display panel 600 is a light emitting diode (LED) display panel. In order to show the arrangement of the LED display panel more clearly, the insulating layer 405 and those portions located on the insulating layer 405 are removed in FIG. 6A, the light emitting unit and those portions located on the light emitting unit are removed in FIG. 6B, and FIG. 6C is a top view of the LED display panel. As shown in FIGS. 6A-6C, the first circuit 102 includes a driving transistor TFT, a light emitting unit LED, and a gate line GATE and a data line DATA, the gate line GATE and the data line DATA extend in different directions. A control terminal g of the driving transistor TFT is connected with the gate line GATE, a first terminal s of the driving transistor TFT is connected with the data line DATA, and a second terminal d of the driving transistor TFT is connected with a first electrode e1 of the light emitting unit LED. The insulating layer 405 covers the gate line GATE, the data line DATA, and a part of the driving transistor TFT other than the second terminal d thereof, and exposes the light emitting unit LED and the second terminal d of the driving transistor TFT. The gate line GATE, the data line DATA, and a second electrode e2 of the light emitting unit LED are electrically connected with the second circuit 103 via the conductors 104, respectively, and can be applied with signals, respectively.

Figure 7:
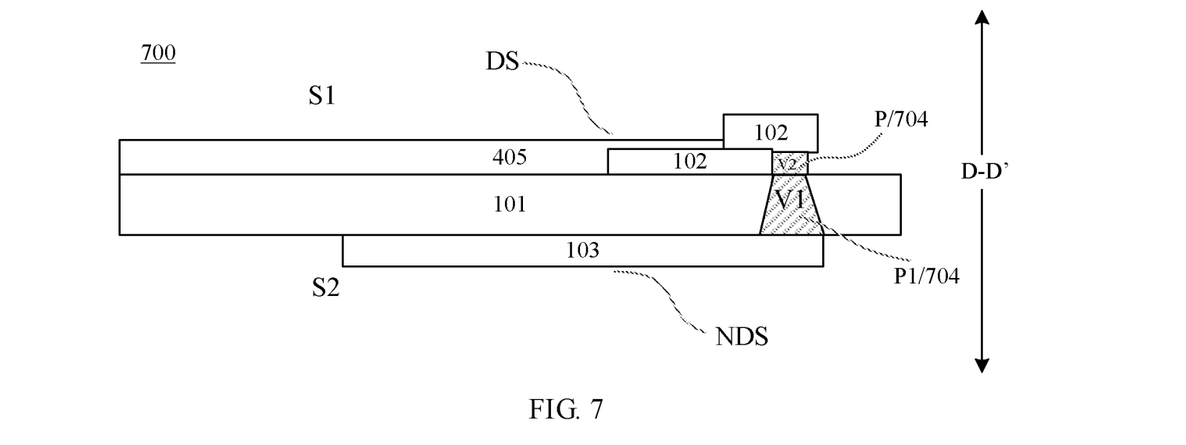
FIG. 7 schematically illustrates a cross-sectional view of a display panel according to still another embodiment of the present disclosure.

FIG. 7 is a schematic cross-sectional view of a display panel according to still another embodiment of the present disclosure. The display panel shown in FIG. 7 has the same structure and/or configuration as the display panel shown in FIG. 4, except for the conductor 704. Therefore, elements having substantially the same functions as those in the embodiment shown in FIG. 4 will be numbered the same here, and will not be described and/or illustrated in detail here for the sake of brevity.

Compared with the display panel 400 shown in FIG. 4, the conductor 704 in FIG. 7 includes a conductive portion P1 penetrating the insulating substrate 101 in the first direction D-D' and a conductive pillar P penetrating the insulating layer 405 in the first direction D-D'. The via hole V1 penetrates the insulating substrate 101 and is filled with a conductive material, so as to form the conductive portion P1. The via hole V2 penetrates the insulating layer 405 and is filled with a conductive material, so as to form the conductive pillar P. The conductive pillar P is electrically connected with the conductive portion P1. As shown in FIG. 7, the conductive portion P1 is in contact with the conductive pillar P, but is not limited thereto.

The accompanying drawings of the embodiments of the present disclosure are illustrated by taking that the via hole V1 is located in the non-display region B-B' as an example, however, it is not limited to this case. For example, in some embodiments, in order to further reduce the bezel, the via hole V1 can be located in the display region A-A', so that the conductive portion P1 is also located in the display region A-A'.

The accompanying drawings of the embodiments of the present disclosure are illustrated by taking that the via hole V2 is located in the non-display region B-B' as an example, however, it is not limited to this case. For example, in some embodiments, in order to further reduce the bezel, the via hole V2 can be located in the display region A-A', so that the conductive pillar P is also located in the display region A-A'.

In the display panel provided by the present disclosure, if the thickness of the display panel in the first direction is large, it is relatively expensive and difficult to realize to integrally form a conductor throughout the entire display panel in an actual process. Therefore, the conductor can be provided by providing the conductive portion P1 and the conductive pillar P, respectively, thereby reducing the process difficulty and the process cost.

Further, as shown in FIG. 7, the via hole V1 has a tapered shape from the second side to the first side of the insulating substrate 101. By providing the via hole with a tapered shape, it is relatively easy to fill the via hole with a conductive material, so as to avoid the case in which circuit disconnection is formed at the via hole due to insufficient filling of the conductive material. In an exemplary embodiment, the tapered shape has a slope angle of 45-90 degrees.

For example, as shown in FIG. 7, an area of a cross section of a side of the conductive portion P1 close to the first circuit 102 is smaller than an area of a cross section of a side of the conductive portion P1 close to the second circuit 103.

For example, as shown in FIG. 7, the conductive portion P1 is in contact with a sidewall for forming the via hole V1.

In an exemplary embodiment of the present disclosure, the first circuit includes one or more of the following: a gate driving circuit and a driving transistor electrically connected with each other; a pixel driving circuit; a peripheral circuit; and a compensation circuit. Accordingly, the second circuit includes an integrated driving circuit which is configured to provide a gate driving signal, a source driving signal, a power level, a control signal and the like for the display panel.

Another aspect of the present disclosure provides a display device which includes any one of the above display panels.

In such a display device, the first circuit and the second circuit are provided at opposite sides of the display panel, respectively, and the first circuit and the second circuit are electrically connected via the conductor. Compared with the scheme in which both the first circuit and the second circuit are provided at the periphery of the display region, the bezel region of the display device provided by the embodiment of the present disclosure can be significantly reduced, and the integration of interconnection structures in the display device can be improved, thereby being beneficial to miniaturization and narrow bezel of the display device.

Figure 8:
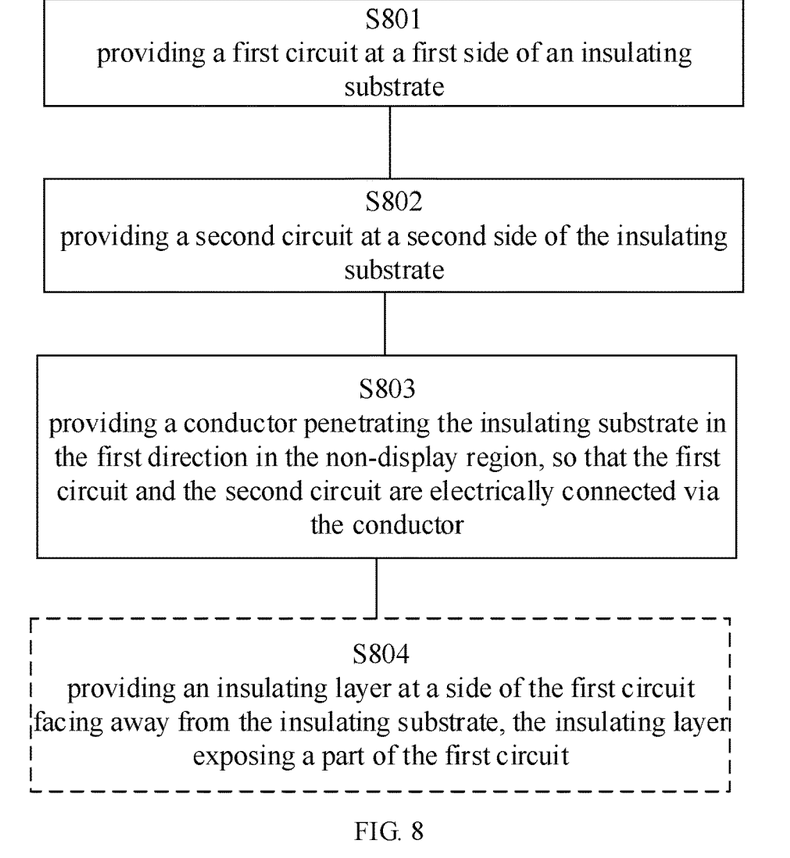
FIG. 8 schematically illustrates a flowchart of a manufacturing method of a display panel according to an embodiment of the present disclosure.

The embodiments of the present disclosure further provide a manufacturing method of the display panel described above. The display surface of the display panel includes a display region and a non-display region surrounding the display region. As shown in FIG. 8, in step S801, providing a first circuit at a first side of an insulating substrate. The first circuit may be a gate driving circuit and a driving transistor which are electrically connected with each other, a pixel driving circuit, a peripheral circuit, a compensation circuit, etc. And the first circuit may be provided by adopting process steps commonly used in the art, such as deposition, photolithography, etching, sputtering, etc.

In step S802, providing a second circuit at a second side of the insulating substrate, the first side and the second side of the insulating substrate are opposite to each other in a first direction perpendicular to the display surface. The second circuit may include an integrated driving circuit which is configured to provide a gate driving signal, a source driving signal, a power level, a control signal and the like for the display panel.

In step S803, providing a conductor penetrating the insulating substrate in the first direction in the non-display region, so that the first circuit and the second circuit are electrically connected via the conductor.

In the display panel manufactured by the above method, the first circuit and the second circuit are provided at opposite sides of the display panel, respectively, and the first circuit and the second circuit are electrically connected via the conductor. Compared with the scheme in which both the first circuit and the second circuit are provided at the periphery of the display region, the bezel region of the display panel provided by the embodiment of the present disclosure can be significantly reduced, and the integration of interconnection structures in the display panel can be improved, thereby being beneficial to miniaturization and narrow bezel of the display panel.

Optionally, in step S804, the above method further includes providing an insulating layer at a side of the first circuit facing away from the insulating substrate, the insulating layer exposing a part of the first circuit. The conductor also penetrates the insulating layer in the first direction.

In the case where the optional step S804 is included, step S803 may include: forming a via hole V1 penetrating the insulating substrate in the first direction; forming a conductive pillar P penetrating the insulating layer in the first direction; and filling the via hole V1 with a conductive material to form a conductive portion P1. The conductive pillar P is in electrical contact with the conductive portion P1.

For example, in the case where the optional step S804 is included, step S803 may sequentially include the following steps: forming a conductive pillar P penetrating the insulating layer in the first direction; forming a via hole v1 penetrating the insulating substrate in the first direction; and filling the via hole V1 with a conductive material to form a conductive portion P1.

Figure 9A:
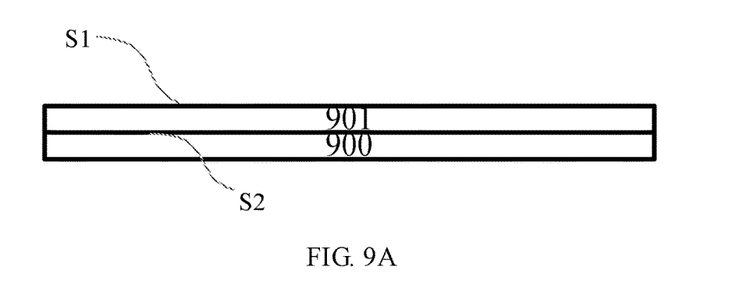
FIGS. 9A-9L illustrate schematic cross-sectional views of steps of a manufacturing method of a display panel according to an embodiment of the present disclosure.

According to the above method, a rigid or flexible display panel can be manufactured. For example, FIGS. 9A-9L illustrate schematic cross-sectional views of steps of a manufacturing method of a flexible display panel according to one embodiment of the present disclosure. As shown in FIG. 9A, firstly providing an insulating substrate 901 on a first carrier 900. A second side S2 of the insulating substrate 901 faces the first carrier 900. The first carrier 900 may be a glass substrate to provide support for the insulating substrate 901. The insulating substrate 901 is formed of a flexible insulating material, such as polyimide (PI), polydimethylsiloxane (PDMS), etc.

Figure 9B:
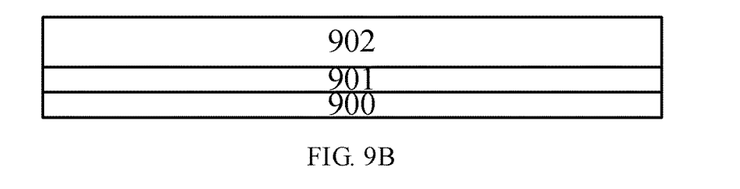
Figure 9C:
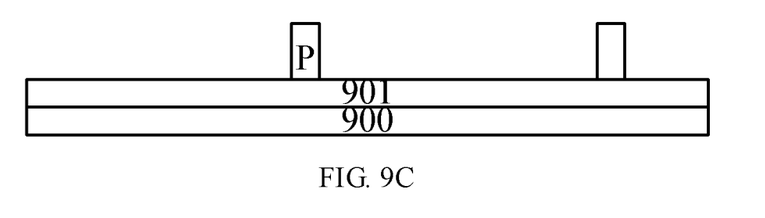

Then, as shown in FIG. 9B, depositing a conductive material layer 902, which may have a thickness of 2-10 μm and may include copper, on the insulating substrate 901. And then, as shown in FIG. 9C, patterning the conductive material layer 902 to form a conductive pillar P.

Figure 9D:
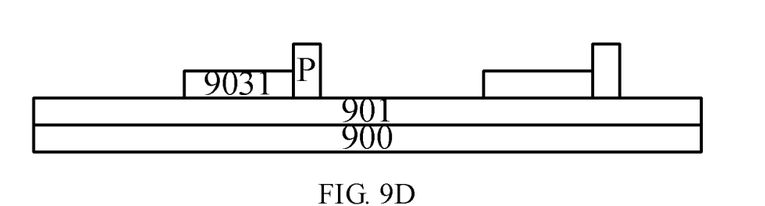

Next, as shown in FIG. 9D, forming a first part 9031 of the first circuit on the insulating substrate 901 by processes such as deposition, etching, etc. The first part 9031 is in electrical contact with the conductive pillar P. For example, the first part 9031 of the first circuit may be a driving transistor TFT, a gate line GATE and a data line DATA in the embodiment shown in FIGS. 5A-5C. Alternatively, the first part 9031 of the first circuit may be the gate line GATE, the data line DATA, and a part of the driving transistor TFT other than the second terminal d in the embodiment shown in FIGS. 6A-6C.

Figure 9E:
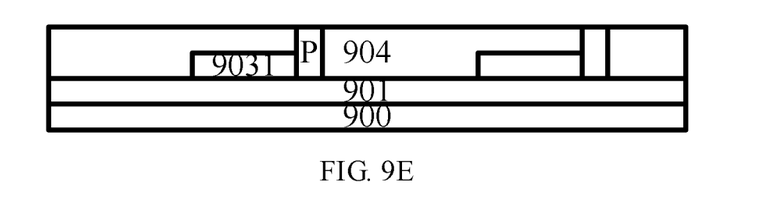

Then, as shown in FIG. 9E, depositing an insulating layer 904 on the first part 9031 of the first circuit. The insulating layer 904 covers the first part 9031 of the first circuit and exposes the conductive pillar P.

Figure 9F:
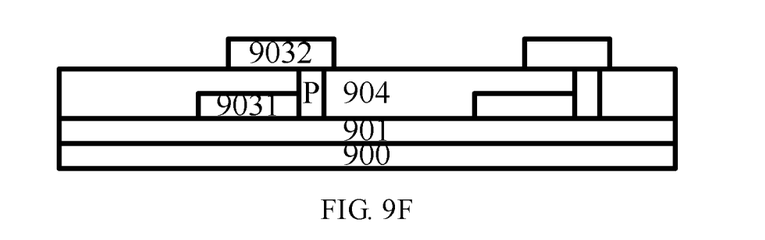

Next, as shown in FIG. 9F, forming a second part 9032 of the first circuit on the insulating layer 904, so that the second part 9032 is in electrical contact with the conductive pillar P. For example, the second part 9032 of the first circuit may be the light emitting unit OLED in the embodiment shown in FIGS. 5A-5C. Alternatively, the second part 9032 of the first circuit may be the light emitting unit LED and the second terminal d of the driving transistor TFT in the embodiment shown in FIGS. 6A-6C.

Figure 9G:
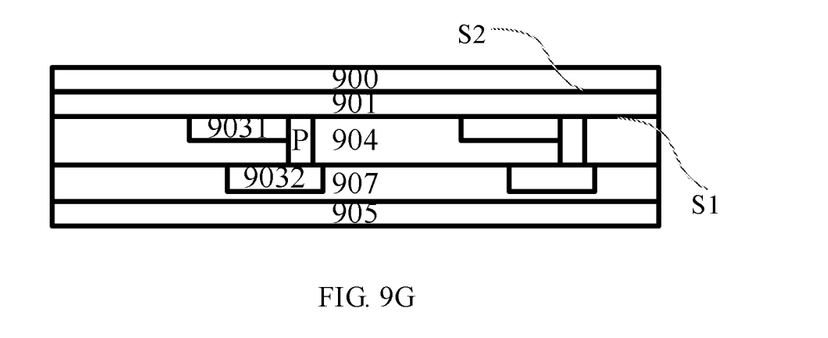

After forming the first circuit, as shown in FIG. 9G bonding the insulating substrate 901 to a second carrier 905. The first side S1 of the insulating substrate 901 faces the second carrier 905. For example, the first side S1 of the insulating substrate 901 can be bonded to the second carrier 905 by an adhering method using an adhesive material 907, so as to provide support for the insulating substrate 901. Similar to the first carrier 900, the second carrier 905 may also be a glass substrate.

Figure 9H:
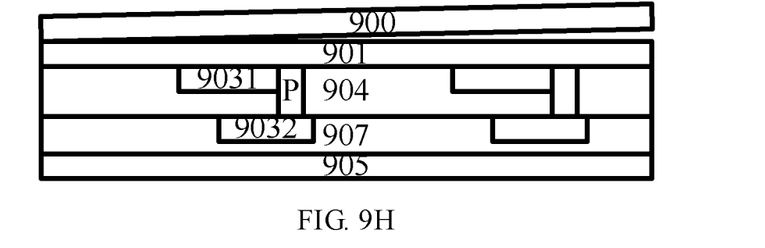

Thereafter, removing the first carrier 900 from the insulating substrate 901, as shown in FIG. 9H. For example, the first carrier 900 can be removed from the insulating substrate 901 by a laser lift-off process.

Figure 9I:
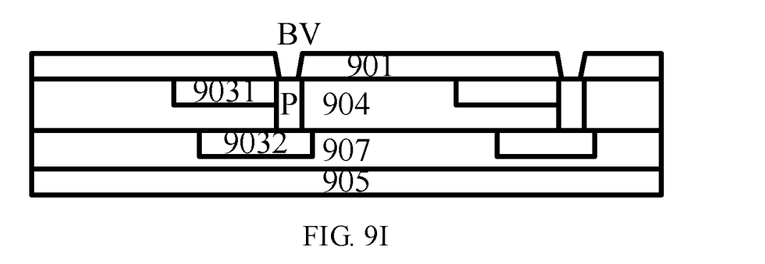
Figure 9J:
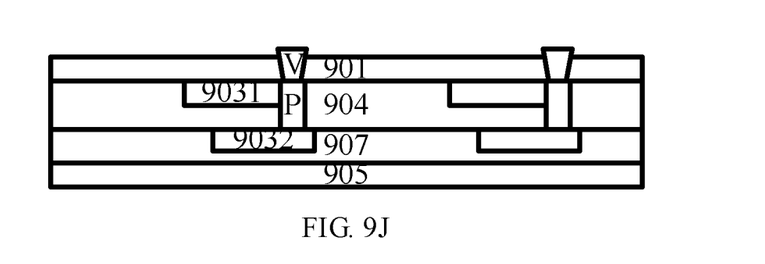

Then, as shown in FIG. 9I, forming a blind hole BV in the insulating substrate 901 by etching. Then, filling a conductive material into the blind hole BV by, for example, electroplating, to form a conductive portion V, as shown in FIG. 9J. The blind hole BV may have a tapered shape from the second side (upper side) of the insulating substrate 901 to the first side (lower side) of the insulating substrate 901, so as to promote filling of the conductive material.

Figure 9K:
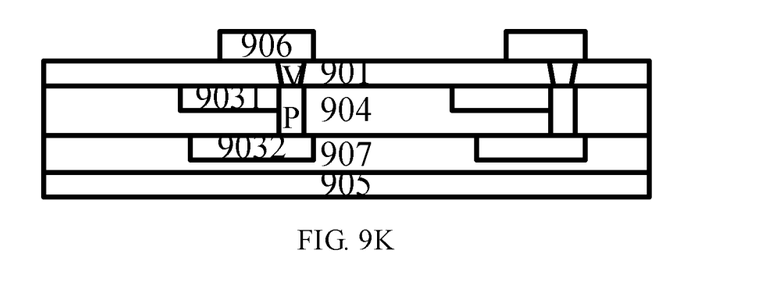

After forming the conductive portion V by filling the blind hole BV, as shown in FIG. 9K, providing a second circuit 906 at the second side S2 of the insulating substrate 901. The second circuit 906 is in electrical contact with the conductive portion V and may include an integrated driving circuit.

Figure 9L:
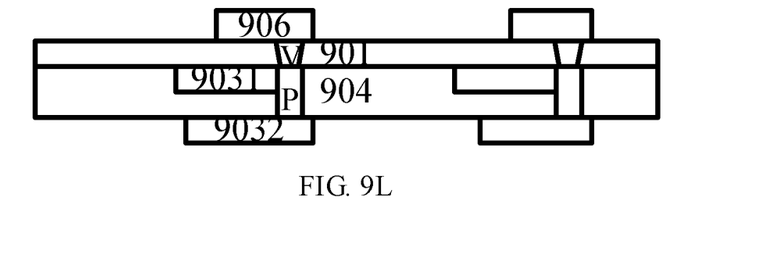

Finally, removing the second carrier 905 from the insulating substrate 901, for example, by removing the adhesive material 907, so as to finally form a flexible display panel with high-density interconnections and narrow bezel, as shown in FIG. 9L.

Particularly, in the above embodiment, after providing the first circuit, forming a via hole filled with a conductive material, so that the removal of the first carrier is not affected by the conductive material in the conductive via hole, thereby easily obtaining a flexible display panel.

In the usual process flow, firstly forming a via hole in the insulating substrate, and then manufacturing other circuit elements on the insulating substrate. However, if a via hole to be filled with a conductive material is formed before removing the first carrier, the conductive material in the via hole will make it difficult to remove the first carrier. In view of this, in the embodiment of the present disclosure, firstly providing the first circuit, and then providing a via hole in the insulating substrate, so that the removal of the first carrier is not affected, and thus the flexible display panel is easily obtained.

It should be noted that two elements electrically connected with each other are shown as being in direct electrical contact in FIGS. 9A-9L, but this is only illustrative. In other embodiments of the present disclosure, two elements electrically connected with each other can be electrically connected with each other through wires or other intermediate elements.

The concept of the present disclosure can be widely applied to various electronic systems with display function, such as a display, a mobile phone, a notebook computer, a television, a navigator, etc.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the described object is changed, the relative position relationship may be changed accordingly.

The above are only specific implementations of the present disclosure, and the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be determined based on the protection scope of the claims.

What is claimed is:

1. A display panel, comprising:
an insulating substrate;
a first circuit at a first side of the insulating substrate; and
a second circuit at a second side of the insulating substrate,
wherein the display panel comprises a display surface, the first side and the second side of the insulating substrate are opposite to each other in a first direction perpendicular to the display surface, and the first circuit and the second circuit are electrically connected via a conductor penetrating the insulating substrate in the first direction,
the display panel further comprises an insulating layer which is at a side of the first circuit facing away from the insulating substrate and exposes a part of the first circuit, wherein the conductor penetrates the insulating layer in the first direction,
wherein the conductor comprises a conductive portion formed by filling a conductive material into a via hole penetrating the insulating substrate in the first direction, and a conductive pillar penetrating the insulating layer in the first direction, and the conductive pillar is electrically connected with the conductive portion,
wherein an area of a cross section of a side of the conductive portion close to the first circuit is smaller than an area of a cross section of a side of the conductive portion close to the second circuit.

2. The display panel according to claim 1, wherein the display surface comprises a display region and a non-display region surrounding the display region, and the conductor is located in the non-display region.

3. The display panel according to claim 1, wherein the display surface comprises a display region, and the conductor is located in the display region.

4. The display panel according to claim 1, wherein a plurality of conductors are provided,
the first circuit comprises a driving transistor, a light emitting unit, a gate line and a data line, wherein the gate line and the data line extend in different directions,
the insulating layer covers the driving transistor, the gate line and the data line, and exposes the light emitting unit,
a control terminal of the driving transistor is connected with the gate line, a first terminal of the driving transistor is connected with the data line, and a second terminal of the driving transistor is connected with a first electrode of the light emitting unit, and
the gate line, the data line, and a second electrode of the light emitting unit are electrically connected with the second circuit via the plurality of conductors, respectively.

5. The display panel according to claim 1, wherein a plurality of conductors are provided,
the first circuit comprises a driving transistor, a light emitting unit, a gate line and a data line, wherein the gate line and the data line extend in different directions,
a control terminal of the driving transistor is connected with the gate line, a first terminal of the driving transistor is connected with the data line, and a second terminal of the driving transistor is connected with a first electrode of the light emitting unit,
the insulating layer covers the gate line, the data line, and a part of the driving transistor other than the second terminal of the driving transistor, and exposes the light emitting unit and the second terminal of the driving transistor, and
the gate line, the data line, and a second electrode of the light emitting unit are electrically connected with the second circuit via the plurality of conductors, respectively.

6. The display panel according to claim 1, wherein the conductive portion is in contact with the conductive pillar.

7. The display panel according to claim 1, wherein the via hole has a tapered shape from the second side to the first side of the insulating substrate.

8. The display panel according to claim 7, wherein the tapered shape has a slope angle of 45-90 degrees.

9. A manufacturing method of a display panel, comprising:
providing a first circuit at a first side of an insulating substrate;
providing a second circuit at a second side of the insulating substrate, wherein the first side and the second side of the insulating substrate are opposite to each other in a first direction, and the first direction is perpendicular to a display surface of the display panel; and
providing a conductor penetrating the insulating substrate in the first direction, so that the first circuit and the second circuit are electrically connected via the conductor,
wherein the providing the first circuit, the providing the second circuit, and the providing the conductor are sequentially performed in the following order:
providing the first circuit, providing the conductor, and providing the second circuit,
wherein after the providing the first circuit and before the providing the conductor, the method further comprises turning over the insulating substrate and forming a via hole in the insulating substrate.

10. The method according to claim 9, wherein the via hole has a tapered shape from the second side to the first side of the insulating substrate.

11. The method according to claim 9, further comprising:
providing an insulating layer at a side of the first circuit facing away from the insulating substrate, the insulating layer exposing a part of the first circuit,
wherein the conductor penetrates the insulating layer in the first direction.

12. The method according to claim 11, further comprising:
providing the insulating substrate on a first carrier before providing the first circuit and the second circuit, wherein the second side of the insulating substrate faces the first carrier;
bonding the insulating substrate to a second carrier after providing the first circuit and before providing the second circuit, wherein the first side of the insulating substrate faces the second carrier;
removing the first carrier after bonding the insulating substrate to the second carrier and before providing the second circuit; and
removing the second carrier after providing the second circuit,
wherein the insulating substrate is formed of a flexible insulating material.

13. The method according to claim 11, wherein the providing the conductor penetrating the insulating substrate in the first direction comprises:
forming a via hole penetrating the insulating substrate in the first direction;
forming a conductive pillar penetrating the insulating layer in the first direction; and
filling the via hole with a conductive material to form a conductive portion,
wherein the conductive pillar is in contact with the conductive portion.

14. The method according to claim 9, wherein the providing the conductor penetrating the insulating substrate in the first direction comprises:
forming a via hole penetrating the insulating substrate in the first direction;
forming a conductive pillar penetrating the insulating layer in the first direction; and
filling the via hole with a conductive material to form a conductive portion,
wherein the conductive pillar is in contact with the conductive portion, and
the forming the conductive pillar is performed before the forming the via hole penetrating the insulating substrate.

15. A manufacturing method of a display panel, comprising:

providing a first circuit at a first side of an insulating substrate;

providing a second circuit at a second side of the insulating substrate, wherein the first side and the second side of the insulating substrate are opposite to each other in a first direction, and the first direction is perpendicular to a display surface of the display panel; and providing a conductor penetrating the insulating substrate in the first direction, so that the first circuit and the second circuit are electrically connected via the conductor, the method further comprises:

providing an insulating layer at a side of the first circuit facing away from the insulating substrate, the insulating layer exposing a part of the first circuit, wherein the conductor penetrates the insulating layer in the first direction, wherein the providing the conductor penetrating the insulating substrate in the first direction comprises:

forming a via hole penetrating the insulating substrate in the first direction;

forming a conductive pillar penetrating the insulating layer in the first direction; and filling the via hole with a conductive material to form a conductive portion, wherein the conductive pillar is in contact with the conductive portion, wherein the forming the conductive pillar is performed before the forming the via hole penetrating the insulating substrate.

16. The method according to claim 15, wherein the providing the first circuit, the providing the second circuit, and the providing the conductor are sequentially performed in the following order:

providing the first circuit, providing the conductor, and providing the second circuit.

17. The method according to claim 16, wherein after the providing the first circuit and before the providing the conductor, the method further comprises turning over the insulating substrate and forming a via hole in the insulating substrate.

* * * * *